(12) United States Patent
Hayashi et al.

(10) Patent No.: US 10,121,917 B2
(45) Date of Patent: Nov. 6, 2018

(54) SOLAR CELL AND SOLAR CELL MODULE

(71) Applicant: Panasonic Intellectual Property Management Co., Ltd., Osaka-shi, Osaka (JP)

(72) Inventors: Naofumi Hayashi, Osaka (JP); Takahiro Mishima, Hyogo (JP); Tsuyoshi Takahama, Osaka (JP); Tsutomu Yamaguchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/072,903

(22) Filed: Mar. 17, 2016

(65) Prior Publication Data

US 2016/0197210 A1 Jul. 7, 2016

Related U.S. Application Data

(63) Continuation of application No. PCT/JP2014/003952, filed on Jul. 28, 2014.

(30) Foreign Application Priority Data

Sep. 19, 2013 (JP) ................................ 2013-194284

(51) Int. Cl.
*H01L 31/00* (2006.01)
*H01L 31/0224* (2006.01)
(Continued)

(52) U.S. Cl.
CPC .............. *H01L 31/022458* (2013.01); *H01L 31/022441* (2013.01); *H01L 31/03529* (2013.01);
(Continued)

(58) Field of Classification Search
CPC ..... H01L 31/022458; H01L 31/022441; H01L 31/0516; H01L 31/03529; H01L 31/048; H01L 31/0747; Y02E 10/50
(Continued)

(56) References Cited

U.S. PATENT DOCUMENTS

2013/0186456 A1 7/2013 Ide et al.

FOREIGN PATENT DOCUMENTS

JP 2010-283052 A 12/2010
JP 2010283052 A * 12/2010 ......... H01L 31/0516
(Continued)

OTHER PUBLICATIONS

English machine translation of JP 2010-283052 A.*
(Continued)

*Primary Examiner* — Angelo Trivisonno
(74) *Attorney, Agent, or Firm* — McDermott Will & Emery LLP

(57) ABSTRACT

A solar cell includes: a base substrate that has a principle surface; a first semiconductor layer provided in a first region on the principle surface; a second semiconductor layer provided in a second region on the principle surface; an n-side electrode provided on the first semiconductor layer; a p-side electrode provided on the second semiconductor layer; and grooves that separate the n-side electrode and the p-side electrode from each other. The respective widths of the grooves in a direction in which the n-side electrode and the p-side electrode are spaced apart are set to be wider in the outer peripheral region than in the inner region.

5 Claims, 10 Drawing Sheets

(51) Int. Cl.
  *H01L 31/048* (2014.01)
  *H01L 31/0747* (2012.01)
  *H01L 31/0352* (2006.01)
  *H01L 31/05* (2014.01)

(52) U.S. Cl.
  CPC ........ *H01L 31/048* (2013.01); *H01L 31/0516* (2013.01); *H01L 31/0747* (2013.01); *Y02E 10/50* (2013.01)

(58) Field of Classification Search
  USPC ....................................................... 136/256
  See application file for complete search history.

(56) References Cited

FOREIGN PATENT DOCUMENTS

| | | |
|---|---|---|
| JP | 2011-176010 A | 9/2011 |
| JP | 3173495 U | 2/2012 |
| JP | 2012-182168 A | 9/2012 |
| WO | 2011/093329 A1 | 8/2011 |

OTHER PUBLICATIONS

English machine translation of JP 2010-283052 A. (Year: 2010).*
International Search Report issued in PCT/JP20141003952, dated Aug. 26, 2014.
Notification of Reasons for Refusal dated Jun. 12, 2018 in Japanese Patent Application No. 2015-537540, including English Translation (6 pages).

\* cited by examiner

SOLAR CELL AND SOLAR CELL MODULE

RELATED APPLICATION

Priority is claimed to Japanese Patent Application No. 2013-194284, filed on Sep. 19, 2013, the entire content of which is incorporated herein by reference.

BACKGROUND

1. Field of the Invention

The present invention relates to a solar cell and particularly to a back-contact type solar cell.

2. Description of the Related Art

Solar cells having high power generation efficiency include back-contact type solar cells with an n-type region and a p-type region formed on a back surface thereof, which is opposite to a light-receiving surface on which light becomes incident. In a back-contact type solar cell, both an n-side electrode and a p-side electrode for extracting electric power that has been generated are provided on a back surface of the back-contact type solar cell. The n-side electrode and the p-side electrode each include a plated layer that is formed by a plating method.

SUMMARY

A back-contact type solar cell desirably has an electrode structure with high power collection efficiency while an n-side electrode and a p-side electrode that are provided on a back surface of the back-contact type solar cell are separated from each other.

In this background, a purpose of the present invention is to provide a solar cell and a solar cell module with improved reliability.

A solar cell according to one embodiment of the present invention includes: a base substrate that has a principle surface; a first semiconductor layer that is provided in a first region on the principle surface; a second semiconductor layer that is provided in a second region, which is different from the first region, on the principle surface; an n-side electrode that is provided on the first semiconductor layer; a p-side electrode that is provided on the second semiconductor layer; and a groove that separates the n-side electrode and the p-side electrode from each other. The principle surface has an outer peripheral region provided along the outer periphery of the principle surface and an inner region provided inside the outer peripheral region. The width of the groove in a direction in which the n-side electrode and the p-side electrode are spaced apart is set to be wider in the outer peripheral region than in the inner region.

Another embodiment of the present invention relates to a solar cell module. This solar cell module includes a plurality of solar cells and a sealing layer that seals the solar cells. The solar cells include: a base substrate that has a principle surface; a first semiconductor layer that is provided in a first region on the principle surface; a second semiconductor layer that is provided in a second region, which is different from the first region, on the principle surface; an n-side electrode that is provided on the first semiconductor layer; a p-side electrode that is provided on the second semiconductor layer; and a groove that separates the n-side electrode and the p-side electrode from each other. The principle surface has an outer peripheral region provided along the outer periphery of the principle surface and an inner region provided inside the outer peripheral region. The width of the groove in a direction in which the n-side electrode and the p-side electrode are spaced apart is set to be wider in the outer peripheral region than in the inner region.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

The invention will now be described by reference to the preferred embodiments. This does not intend to limit the scope of the present invention, but to exemplify the invention.

Hereinafter, an embodiment for carrying out the present invention will be described in detail with reference to the accompanying drawing. In the explanation of the figures, like numerals represent like constituting elements, and duplicative explanations will be omitted appropriately.

An outline of the present invention will be given before a specific description thereof. An embodiment of the present invention relates to a back-contact type solar cell and to a solar cell module in which the back-contact type solar cell is used, and electrodes for extracting electric power that has been generated by the solar cell are provided on a back surface of the solar cell, which is opposite to a light-receiving surface on which light becomes incident. An n-side electrode and a p-side electrode that are provided on the back surface are formed in a comb shape such that the n-side electrode and the p-side electrode interdigitate each other. Between the n-side electrode and the p-side electrode, a groove is provided for separating the electrodes. In the present embodiment, the groove that is provided between the electrodes is provided such that the width of the groove becomes wide in a region that is close to the outer periphery of the back surface and becomes narrow at a central part.

This is because a metal film is likely to become thick in the region close to the outer periphery of the back surface compared to the central part when forming the electrodes by a plating method. In the present embodiment, a short circuit caused due to the contact of the electrodes, which are formed by plating, with each other is prevented by widening the width of the groove at an outer peripheral portion where plating is likely to become thick. This allows the reliability of the solar cell to be increased.

First Embodiment

An explanation will be given in detail regarding the configuration of a solar cell 70 in the present embodiment with reference to FIGS. 1 and 2.

Figure 1:
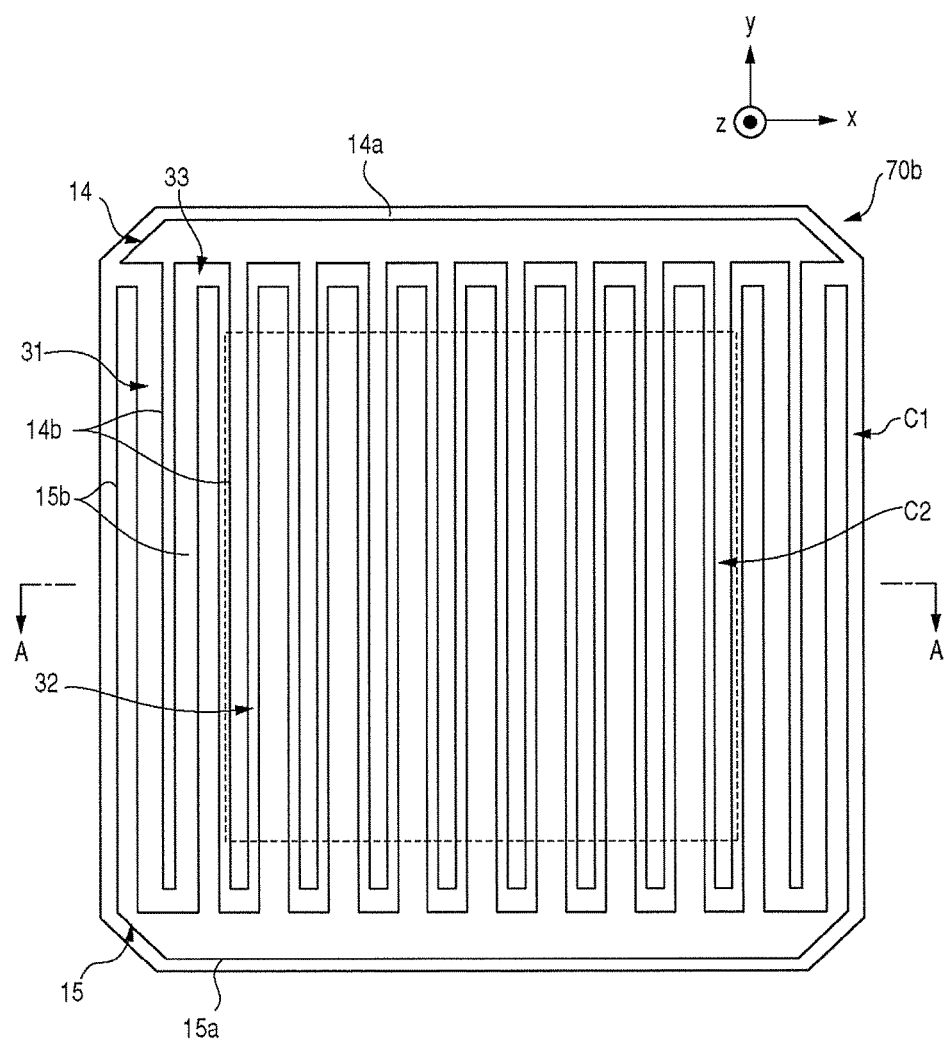
FIG. 1 is a plan view illustrating a solar cell in a first embodiment.

FIG. 1 is a plan view illustrating a solar cell 70 in a first embodiment.

The solar cell 70 is provided with an n-side electrode 14 and a p-side electrode 15, which are provided on a back surface 70b. The n-side electrode 14 is formed in a comb shape including a bus bar electrode 14a extending in a first direction (x direction) and a plurality of finger electrodes 14b extending in a second direction (y direction) that intersects with the first direction. Similarly, the p-side electrode 15 is formed in a comb shape including a bus bar electrode 15a extending in the x direction and a plurality of finger electrodes 15b extending in the y direction. The n-side electrode 14 and the p-side electrode 15 are formed such that the respective comb teeth interdigitate each other. Each of the n-side electrode 14 and the p-side electrode 15 may be formed only with a plurality of finger electrodes and may be a bus bar-less type electrode that does not have a bus bar.

The back surface 70b has an outer peripheral region C1 and an inner region C2. The outer peripheral region C1 is a region that is close to the outer periphery of the back surface 70b and is, for example, a region that has a width of about 5 mm to 10 mm from the outer periphery. The inner region C2 is a region that is located inside the outer peripheral region C1. In the present embodiment, the respective widths of grooves 31, 32, and 33 provided to separate the n-side electrode 14 and the p-side electrode 15 from each other are different in the outer peripheral region C1 and in the inner region C2. The grooves 31 and 33 provided in the outer peripheral region C1 are formed such that the grooves 31 and 33 have a width that is wider than that of the groove 32 provided in the inner region C2. The details thereof will be described later using FIG. 2.

Figure 2:
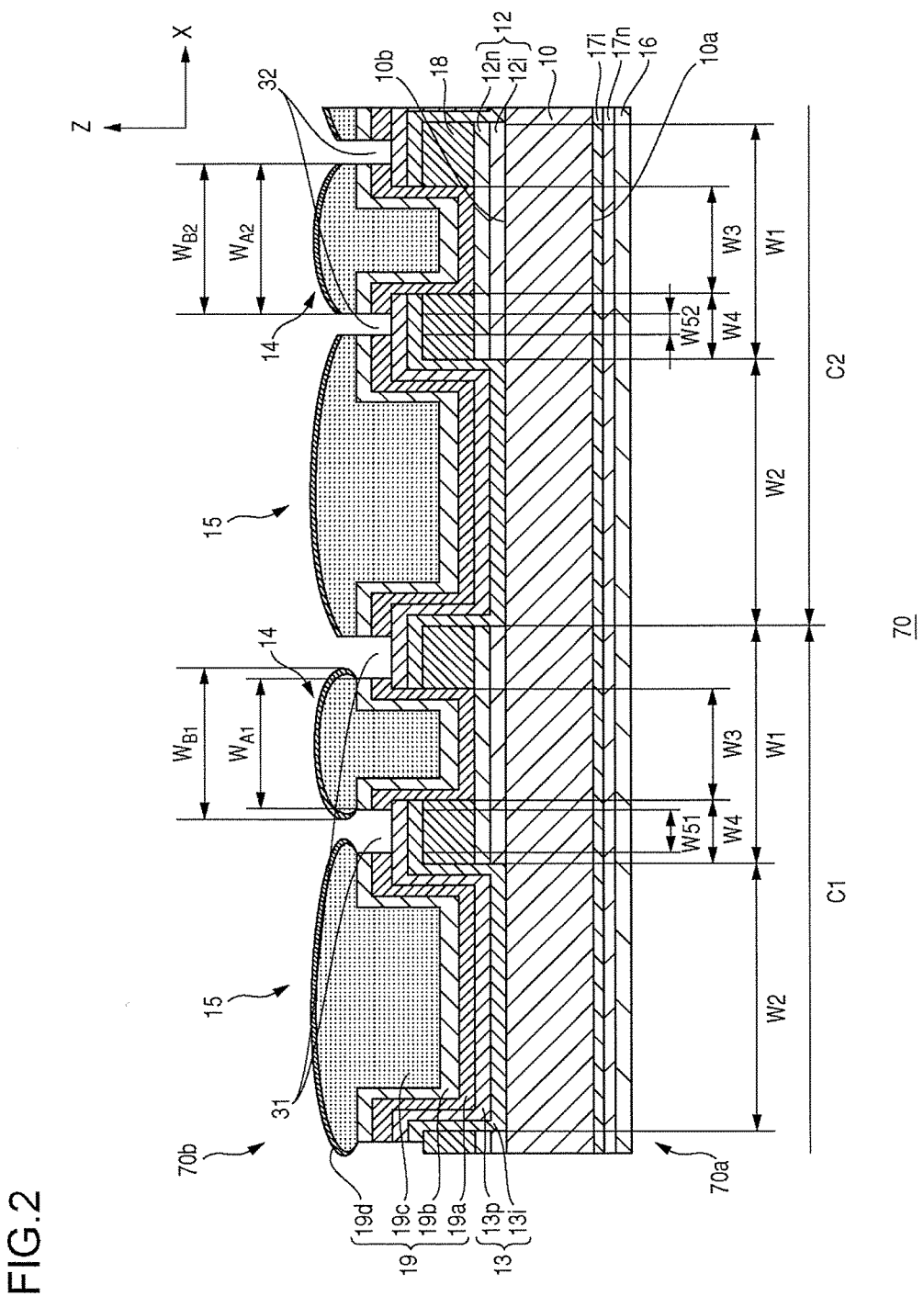
FIG. 2 is a cross-sectional view illustrating a structure of the solar cell in the first embodiment.

FIG. 2 is a cross-sectional view illustrating the structure of the solar cell 70 in the first embodiment. FIG. 2 is a diagram illustrating a cross-sectional view along line A-A in FIG. 1 and illustrates the structure of the groove 31 provided in the outer peripheral region C1 and the structure of the groove 32 provided in the inner region C2.

The solar cell 70 is provided with a base substrate 10, a first conductive-type layer 12n, a first i-type layer 12i, a second conductive-type layer 13p, a second i-type layer 13i, a first insulating layer 16, a third conductive-type layer 17n, a third i-type layer 17i, a second insulating layer 18, and an electrode layer 19. The electrode layer 19 forms the n-side electrode 14 or the p-side electrode 15. The solar cell 70 is a back-contact type solar cell having a heterojunction.

The base substrate 10 has a first principle surface 10a provided on the side of a light-receiving surface 70a and a second principle surface 10b provided on the side of the back surface 70b. The base substrate 10 absorbs light that becomes incident on the first principle surface 10a and generates electrons and positive holes as carriers. The base substrate 10 is formed of a crystalline semiconductor substrate that has an n-type or p-type conductivity type. Specific examples of the crystalline semiconductor substrate include, for example, crystalline silicon (Si) substrates such as monocrystalline silicon substrates, polycrystalline silicon substrates, etc.

In the present embodiment, a case is shown where the base substrate 10 is formed of an n-type monocrystalline silicon substrate. The solar cell can be formed of a semiconductor substrate other than a crystalline semiconductor substrate as a base substrate. For example, a compound semiconductor substrate formed of gallium arsenide (GaAs), indium phosphide (InP), or the like may be used.

The light-receiving surface 70a means a principal surface on which light (sunlight) mainly becomes incident in the solar cell 70 and, specifically, is a surface on which the major portion of light that enters the solar cell 70 becomes incident. On the other hand, the back surface 70b means the other principal surface opposite to the light-receiving surface 70a.

The third i-type layer 17i formed of a substantially intrinsic amorphous-semiconductor (hereinafter, an intrinsic semiconductor is also referred to as "i-type layer") is provided on the first principle surface 10a of the base substrate 10. The third i-type layer 17i in the present embodiment is formed of i-type amorphous silicon containing hydrogen (H). The thickness of the third i-type layer 17i is not particularly limited as long as the thickness does not substantially contribute to electric power generation. The thickness of the third i-type layer 17i can be, for example, about several nm to 25 nm.

In the present embodiment, it is assumed that an "amorphous semiconductor" includes a microcrystalline semiconductor. A microcrystalline semiconductor is a semiconductor where semiconductor crystals are deposited in an amorphous semiconductor.

A third conductive-type layer 17n having the same conductivity type as that of the base substrate 10 is formed on the third i-type layer 17i. The third conductive-type layer 17n is an amorphous-semiconductor having an n-type conductivity type in which an n-type dopant is added. In the present embodiment, the third conductive-type layer 17n is formed of n-type amorphous silicon containing hydrogen. The thickness of the third conductive-type layer 17n is not particularly limited. The thickness of the third conductive-type layer 17n can be, for example, about 2 nm to 50 nm.

The first insulating layer 16 having both a function for serving as an antireflective film and a function for serving as a protective film is formed on the third conductive-type layer 17n. The first insulating layer 16 can be formed, for example, of silicon oxide ($SiO_2$), silicon nitride (SiN), silicon oxynitride (SiON), or the like. The thickness of the first insulating layer 16 can be appropriately set according to antireflection characteristics and the like as an antireflective film. The thickness of the first insulating layer 16 can be, for example, about 80 nm to 1000 nm.

A stacked structure of the third i-type layer 17i, the third conductive-type layer 17n, and the first insulating layer 16 has a function for serving as a passivation layer of the base substrate 10 and a function for serving as an antireflective film.

A first stacked body 12 and a second stacked body 13 are formed on the second principle surface 10b of the base substrate 10. The first stacked body 12 and the second stacked body 13 are each formed in a comb shape such that the first stacked body 12 and the second stacked body 13 correspond to the n-side electrode 14 and the p-side electrode 15 and are inserted into each other. Therefore, a first region W1 in which the first stacked body 12 is provided and a second region W2 in which the second stacked body 13 is provided are arrayed alternately in the x direction on the second principle surface 10b. Further, the first stacked body 12 and the second stacked body 13 that are adjacent to each other in the x direction are provided being in contact with each other. Therefore, in the present embodiment, the entirety of the second principle surface 10b is substantially covered by the first stacked body 12 and the second stacked body 13.

The first stacked body 12 is formed of a stacked body of a first i-type layer 12i formed on the second principle surface 10b and a first conductive-type layer 12n formed on the first i-type layer 12i. Just like the third i-type layer 17i, the first i-type layer 12i is formed of i-type amorphous silicon containing hydrogen. The thickness of the first i-type layer 12i is not particularly limited as long as the thickness does not substantially contribute to electric power generation. The thickness of the first i-type layer 12i can be, for example, about several nm to 25 nm.

As in the case of the third conductive-type layer 17n, an n-type dopant is added to the first conductive-type layer 12n, and the first conductive-type layer 12n has an n-type conductive-type just like the base substrate 10. More specifically, in the present embodiment, the first conductive-type layer 12n is formed of n-type amorphous silicon containing hydrogen. The thickness of the first conductive-type layer 12n is not particularly limited. The thickness of the first conductive-type layer 12n can be, for example, about 2 nm to 50 nm.

The second insulating layer 18 is formed on the first stacked body 12. The second insulating layer 18 is not provided in a third region W3 corresponding to a central part of the first region W1 in the x direction and is provided in a fourth region W4 corresponding to both ends of the first region W1 excluding the third region W3. The width of the fourth region W4 in which the second insulating layer 18 is formed can be, for example, about one third of the width of the first region W1. The width of the third region W3 in which the second insulating layer 18 is not formed is not particularly limited either and can be, for example, about one third of the width of the first region W1.

The material of the second insulating layer 18 is not particularly limited. The second insulating layer 18 can be formed, for example, of silicon oxide, silicon nitride, silicon oxynitride, or the like. Among them, the second insulating layer 18 is preferably formed of silicon nitride. The second insulating layer 18 preferably contains hydrogen.

In the second principle surface 10b, the second stacked body 13 is formed in the second region W2 in which the first stacked body 12 is not provided and is formed on an end portion in the fourth region W4 in which the second insulating layer 18 is provided. Thus, the both end portions of the second stacked body 13 are provided being overlapped with the first stacked body 12 in a height direction (z direction).

The second stacked body 13 is formed of a stacked body of a second i-type layer 13i formed on the second principle surface 10b and a second conductive-type layer 13p formed on the second i-type layer 13i.

The second i-type layer 13i is formed of i-type amorphous silicon containing hydrogen. The thickness of the second i-type layer 13i is not particularly limited as long as the thickness does not substantially contribute to electric power generation. The thickness of the second i-type layer 13i can be, for example, about several nm to 25 nm.

The second conductive-type layer 13p is an amorphous-semiconductor having a p-type conductivity type in which a p-type dopant is added. More specifically, in the present embodiment, the second conductive-type layer 13p is formed of p-type amorphous silicon containing hydrogen. The thickness of the second conductive-type layer 13p is not particularly limited. The thickness of the second conductive-type layer 13p can be, for example, about 2 nm to 50 nm.

As described above, in the present embodiment, a heterojunction in which the second i-type layer 13i formed of amorphous silicon having a thickness that does not substantially contribute to electric power generation is provided is formed between the crystalline base substrate 10 and the second conductive-type layer 13p. By employing such a heterojunction, recombination of a carrier at a bonded interface between the base substrate 10 and the second stacked body 13 can be suppressed. As a result, photoelectric conversion efficiency can be improved.

The n-side electrode 14 that collects electrons is formed on the first conductive-type layer 12n. On the other hand, the p-side electrode 15 that collects positive holes is formed on the second conductive-type layer 13p. The grooves 31 and 32 are formed between the n-side electrode 14 and the p-side electrode 15. Therefore, the n-side electrode 14 and the p-side electrode 15 are separated by the grooves 31 and 32, and the electrodes are electrically insulated from each other.

The n-side electrode 14 and the p-side electrode 15 are not particularly limited as long as the n-side electrode 14 and the p-side electrode 15 are able to collect carriers. In the present embodiment, the n-side electrode 14 and the p-side electrode 15 are formed of a stacked body of four layers: a first conductive layer 19a through a fourth conductive layer 19d.

The first conductive layer 19a is formed of, for example, a transparent conductive oxide (TCO) in which tin (Sn), antimony (Sb), fluorine (F), aluminum (Al), or the like is doped in a stannic oxide (SnO2), a zinc oxide (ZnO), an indium tin oxide (ITO), or the like. In the present embodiment, the first conductive layer 19a is formed of an indium tin oxide. The thickness of the first conductive layer 19a can be, for example, about 50 nm to 100 nm.

The second conductive layer 19b through the fourth conductive layer 19d are conductive materials that contain copper (Cu), tin (Sn), or the like. However, the examples given are non-limiting. Other metals such as gold (Au), silver (Ag), and the like, other conductive materials, or a combination of those may be used. In the present embodiment, the second conductive layer 19b and the third conductive layer 19c are formed of copper, and the fourth conductive layer 19d is formed of tin. The respective thicknesses of the second conductive layer 19b, the third conductive layer 19c, and the fourth conductive layer 19d can be set to be about 50 nm to 1000 nm, about 10 µm to 20 µm, and about 1 µm to 5 µm, respectively.

The method of forming the first conductive layer 19a through the fourth conductive layer 19d is not particularly limited. For example, the first conductive layer 19a through the fourth conductive layer 19d can be formed by a thin film formation method such as sputtering, chemical vapor deposition, or the like or by a plating method or the like. In the present embodiment, the first conductive layer 19a and the second conductive layer 19b are formed by a thin film formation method, and the third conductive layer 19c and the fourth conductive layer 19d are formed by a plating method. Hereinafter, the third conductive layer 19c and the fourth conductive layer 19d are also referred to as "plated layers."

When forming the third conductive layer 19c and the fourth conductive layer 19d by a plating method, the film thickness of a plated layer formed on the second conductive layer 19b may not be uniform due to differences in the density of electric lines of force caused depending on a location. In the present embodiment, when voltage is applied to the second conductive layer 19b serving as a base for plating, the density of electric lines of force in the outer peripheral region C1 becomes higher than that in the inner region C2. Therefore, the third conductive layer 19c in the outer peripheral region C1 is formed to be thicker than the third conductive layer 19c in the inner region C2.

In the case of thickening the film thickness of the third conductive layer 19c in the inner region C2, the third conductive layer 19c in the outer peripheral region C1 is formed to expand not only in the thickness direction but also in the horizontal direction, as shown in FIG. 2, at this time. Therefore, in the n-side electrode 14 provided in the outer peripheral region C1, the width $W_{A1}$ of the third conductive layer 19c and the fourth conductive layer 19d formed by plating is larger than the width $W_{A1}$ of the first conductive layer 19a and the second conductive layer 19b serving as bases. On the other hand, in the inner region C2, the width $W_{A2}$ of the first conductive layer 19a and the second conductive layer 19b serving as bases is about the same as the width $W_{B2}$ of the third conductive layer 19c and the fourth conductive layer 19d formed by plating.

The solar cell 70 is further provided with grooves 31 and 32. The grooves 31 and 32 are provided between the n-side electrode 14 and the p-side electrode 15 and electrically insulate the electrodes while separating the electrodes. The width of the groove 31 and the width of the groove 32 vary depending on whether a region in which the grooves 31 and 32 are formed is the outer peripheral region C1 or the inner region C2. The groove 31 provided in the outer peripheral region C1 is formed such that the width of the groove 31 is wider than that of the groove 32 provided in the inner region C2. For example, the width W51 of the groove 31 provided in the outer peripheral region C1 is provided such that the width W51 is about 1.1 to 2 times greater than the width W52 of the groove 32 provided in the inner region C2. In the present embodiment, for example, the width W51 of the groove 31 in the outer peripheral region C1 can be about 150 μm, and the width W52 of the groove 32 in the inner region C2 can be about 90 μm.

The width of a groove in this case means an interval between the n-side electrode 14 and the p-side electrode 15 that are separated by the groove and means a distance in a direction in which the n-side electrode 14 and the p-side electrode 15 are spaced apart. As shown in FIG. 1, in the grooves 31 and 32 that separate adjacent finger electrodes 14b and 15b from each other, the respective widths are shown in an x direction that intersects with a y direction in which the finger electrodes 14b and 15b extend. On the other hand, in a groove 33 that separates the bus bar electrode 14a and the finger electrode 15b from each other, the width is shown in the y direction that intersects with the bus bar electrode 14a.

In the present embodiment, the width W51 of the groove 31 is set to be wide in the outer peripheral region C1 in which a plated layer spreads in the horizontal direction and is thus formed easily. Thereby, electrical short circuit can be prevented that is caused as a result of the n-side electrode 14 and the p-side electrode 15 that are adjacent to each other becoming in contact with each other. This allows the reliability of the solar cell 70 to be increased.

Also, by setting the width W51 of the groove 31 and the width W52 of the groove 32 to be different from each other, the width $W_{A2}$ in the inner region C2 can be set to be wider than the width $W_{A1}$ in the outer peripheral region C1 for the first conductive layer 19a and the second conductive layer 19b serving as bases. Thereby, even when the film formation amount of a plated layer formed on the second conductive layer 19b is different, the width $W_{B1}$ and the width $W_{B2}$ of the n-side electrode 14 in the outer peripheral region C1 and the inner region C2, respectively, can be set to be about the same. In the same way, the width of the p-side electrode 15 can be also set to be about the same in the outer peripheral region C1 and the inner region C2. Thereby, the width of the finger electrode 14b and the width of the finger electrode 15b can be set to be uniform regardless of a location, and the power collection efficiency in the solar cell 70 can be increased.

An explanation will now be given of a method of manufacturing a solar cell 70 according to the present embodiment, by mainly referring to FIGS. 3-9.

Figure 3:
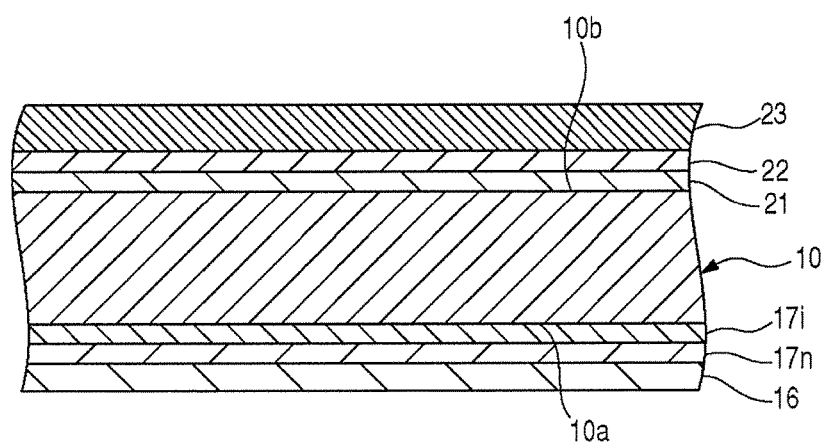
FIG. 3 is a cross-sectional view schematically illustrating a process of manufacturing the solar cell.

First, a base substrate 10 shown in FIG. 3 is prepared, and a first principle surface 10a and a second principle surface 10b of the base substrate 10 are cleaned. The cleaning of the base substrate 10 can be performed using, for example, a hydrofluoric acid (HF) aqueous solution or the like. In this cleaning process, a texture structure is preferably formed on the first principle surface 10a.

Then, an i-type amorphous-semiconductor layer that serves as a third i-type layer 17i and an n-type amorphous-semiconductor layer that serves as a third conductive-type layer 17n are formed on the first principle surface 10a of the base substrate 10. An i-type amorphous-semiconductor layer 21 and an n-type amorphous-semiconductor layer 22 are formed on the second principle surface 10b of the base substrate 10. A method of forming each of the third i-type layer 17i, the third conductive-type layer 17n, the i-type amorphous-semiconductor layer 21, and the n-type amorphous-semiconductor layer 22 is not particularly limited. For example, the third i-type layer 17i, the third conductive-type layer 17n, the i-type amorphous-semiconductor layer 21, and the n-type amorphous-semiconductor layer 22 can be formed by a chemical vapor deposition (CVD) method such as a plasma CVD method.

Then, an insulating layer that serves as a first insulating layer 16 is formed on the third conductive-type layer 17n, and an insulating layer 23 is formed on the n-type amorphous-semiconductor layer 22. The method of forming the first insulating layer 16 and the insulating layer 23 is not particularly limited. For example, the first insulating layer 16 and the insulating layer 23 can be formed by a thin film formation method such as a sputtering method, a CVD method, or the like.

Figure 4:
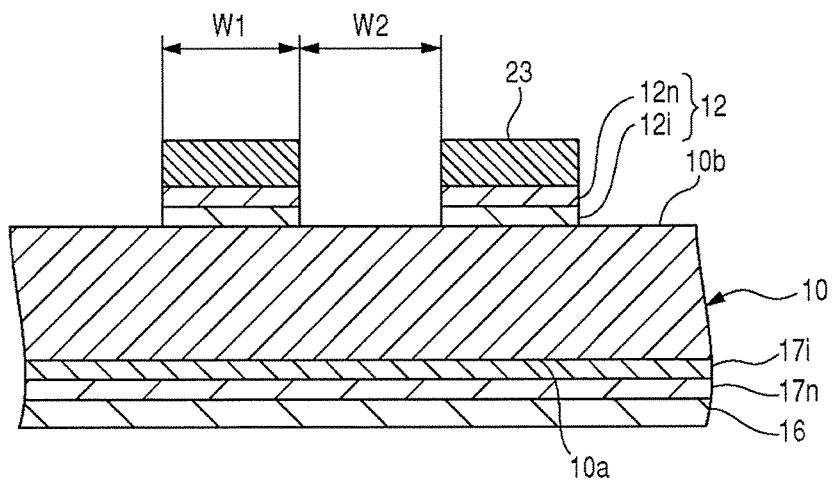
FIG. 4 is a cross-sectional view schematically illustrating the process of manufacturing the solar cell.

As shown in FIG. 4, a portion of the insulating layer 23 is then removed by etching the insulating layer 23. More specifically, a portion of the insulating layer 23 that is located in a second region W2 in which a p-type semiconductor layer is to be bonded to the base substrate 10 in a subsequent process is removed. The etching of the insulating layer 23 can be performed using, for example, an acidic etching solution such as a hydrofluoric acid aqueous solution or the like when the insulating layer 23 is formed of silicon oxide, silicon nitride, or silicon oxynitride.

Then, using the patterned insulating layer 23 as a mask, the i-type amorphous-semiconductor layer 21 and the n-type amorphous-semiconductor layer 22 are etched using an alkaline etching solution. By the etching, a portion of the i-type amorphous-semiconductor layer 21 and a portion of the n-type amorphous-semiconductor layer 22 that are located in the second region not covered by the insulating layer 23 are removed. Thereby, the second region W2 of the second principle surface 10b in which the insulating layer 23 is not provided thereon is exposed. A region in which a first stacked body 12 remains is a first region W1.

Figure 5:
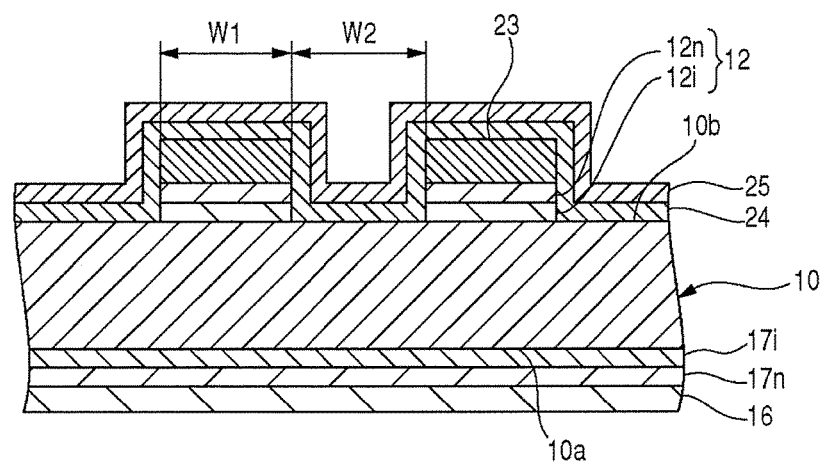
FIG. 5 is a cross-sectional view schematically illustrating the process of manufacturing the solar cell.

As shown in FIG. 5, an i-type amorphous-semiconductor layer 24 is then formed to cover the second principle surface 10b, and a p-type amorphous-semiconductor layer 25 is formed on the i-type amorphous-semiconductor layer 24. A method of forming the i-type amorphous-semiconductor layer 24 and the p-type amorphous-semiconductor layer 25 is not particularly limited. For example, the i-type amorphous-semiconductor layer 24 and the p-type amorphous-semiconductor layer 25 can be formed by a thin film formation method such as a CVD method, or the like.

Figure 6:
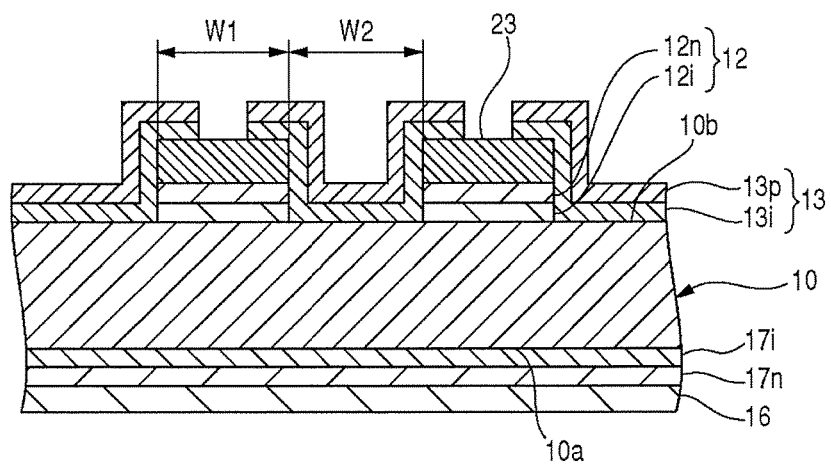
FIG. 6 is a cross-sectional view schematically illustrating the process of manufacturing the solar cell.

As shown in FIG. 6, a portion of a part of the i-type amorphous-semiconductor layer 24 and a portion of a part of the p-type amorphous-semiconductor layer 25 that are located on the insulating layer 23 are etched. Thereby, a second i-type layer 13i is formed from the i-type amorphous-semiconductor layer 24, and a second conductive-type layer 13p is formed from the p-type amorphous-semiconductor layer 25.

Figure 7:
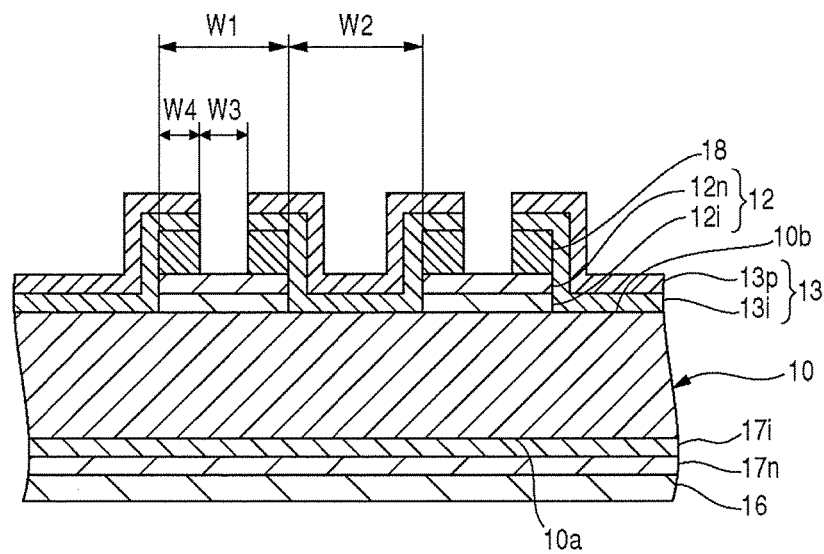
FIG. 7 is a cross-sectional view schematically illustrating the process of manufacturing the solar cell.

As shown in FIG. 7, the insulating layer 23 is then etched. More specifically, a portion of the insulating layer 23 that is exposed is removed by etching from above the second i-type layer 13i and the second conductive-type layer 13p. Thereby, a first conductive-type layer 12n is exposed by forming an opening in the insulating layer 23, and a second insulating layer 18 is formed from the insulating layer 23. A region in which the insulating layer 23 is removed is a third region W3, and a region in which the second insulating layer 18 remains is a fourth region W4.

Figure 8:
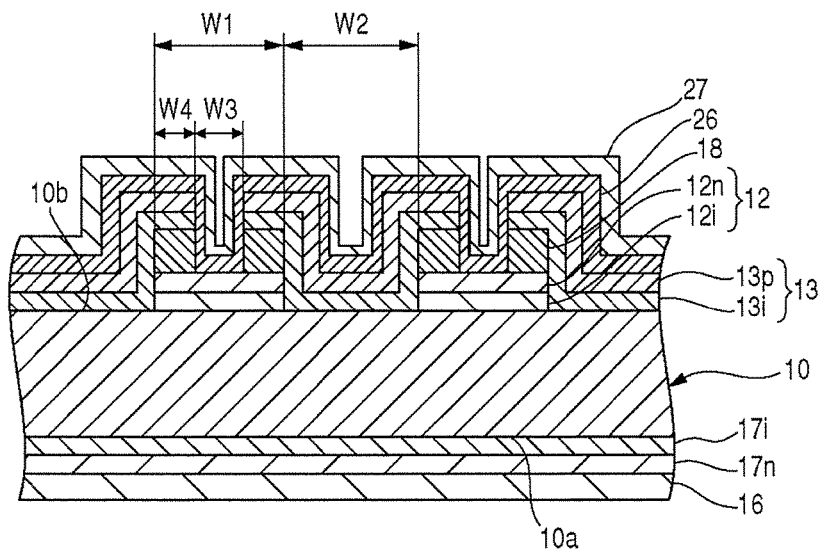
FIG. 8 is a cross-sectional view schematically illustrating the process of manufacturing the solar cell.

Then, as shown in FIG. 8, conductive layers 26 and 27 are formed on the first conductive-type layer 12n and the second conductive-type layer 13p. The conductive layer 26 is a transparent electrode layer of an indium tin oxide (ITO) or the like, and the conductive layer 27 is a metal electrode layer formed of a metal such as copper (Cu) or an alloy. The conductive layers 26 and 27 are formed by a CVD method such as a plasma CVD method or a thin film formation method such as a sputtering method.

Figure 9:
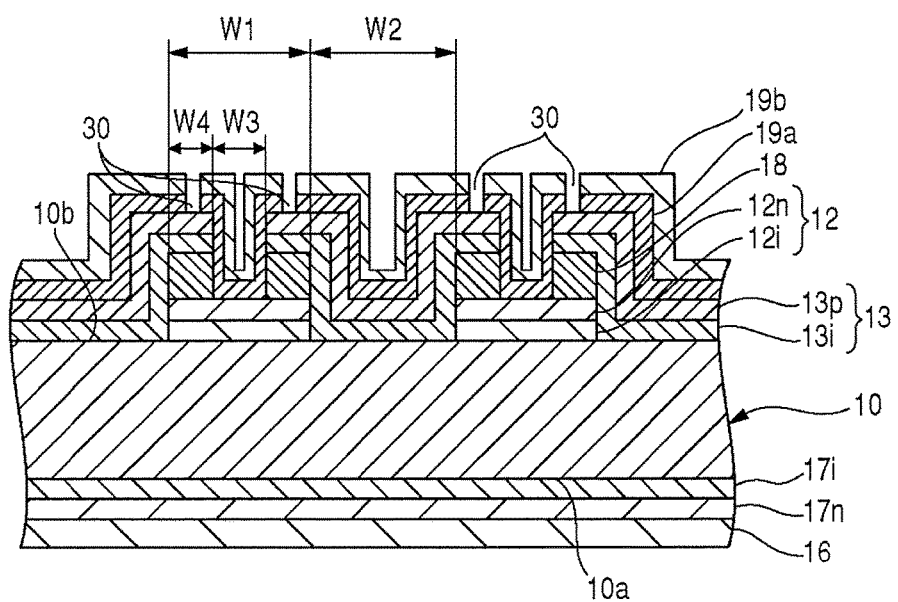
FIG. 9 is a cross-sectional view schematically illustrating the process of manufacturing the solar cell.

As shown in FIG. 9, a portion of the conductive layer 26 and a portion of the conductive layer 27 that are located above the second insulating layer 18 are then divided so as to form a groove 30. Thereby, a first conductive layer 19a and a second conductive layer 19b are formed from the conductive layers 26 and 27, respectively, and an n-type electrode and a p-side electrode are separated. The division of the conductive layers 26 and 27 can be performed by, for example, a photolithography method or the like.

The groove 30 is formed such that the width of the groove 30 is wide in the outer peripheral region C1 shown in FIG. 1 while the width of the groove 30 is narrow in the inner region C2 at this time. For example, by preparing a mask that is provided such that the width of the division varies depending on the region, the groove 30 whose width varies depending on the region can be formed.

At last, a third conductive layer 19c formed of copper (Cu) and a fourth conductive layer 19d formed of tin (Sn) are formed on the first conductive layer 19a and the second conductive layer 19b by a plating method. At the time of the plating, the density of electric lines of force in the outer peripheral region C1 becomes higher than that in the inner region C2. Thus, the third conductive layer 19c in the outer peripheral region C1 is formed to be thicker than the third conductive layer 19c in the inner region C2. Thereby, the third conductive layer 19c that is wider than the width of the second conductive layer 19b, which serves as a base, in the horizontal direction can be formed in the outer peripheral region C1. On the other hand, the third conductive layer 19c that has almost the same width as that of the second conductive layer 19b, which serves as a base, can be formed in the inner region C2.

By the above manufacturing processes, the solar cell 70 shown in FIG. 2 can be formed.

In the solar cell 70 in the present embodiment, the width W51 of the groove 31 is provided to be wide in the outer peripheral region C1. Thus, even when the third conductive layer 19c is formed to be wide in the horizontal direction at the time of plating, a short circuit caused due to the contact of the n-side electrode 14 and the p-side electrode 15, which are adjacent to each other, with each other can be prevented. This allows the reliability of the solar cell 70 to be increased.

In the case of a solar cell in which there is no difference in the width of the groove according to a distance from the outer periphery, the third conductive layer 19c in the outer peripheral region C1 often grows too much in the horizontal direction if the third conductive layer 19c is formed such that the film thickness of the third conductive layer 19c in the inner region C2 is sufficient, causing adjacent electrodes to come into contact with each other. On the other hand, if the film formation amount is suppressed such that the electrodes provided in the outer peripheral region C1 do not come into contact with each other, the film thickness of the third conductive layer 19c in the inner region C2 becomes insufficient, and the power collection efficiency may be lowered. Therefore, in the case of a solar cell in which there is no difference in the width of a groove, it is necessary to provide a plating resist in an outer peripheral region C1 in order to prevent a short circuit between electrodes in the outer peripheral region C1 while maintaining a film thickness of a certain level or more as electrodes. In the case of using a manufacturing method of providing a plating resist, a yield rate may be lowered in addition to an increase in cost in association with an increase in the manufacturing processes.

On the other hand, in the solar cell 70 according to the present embodiment, by providing a difference in the width of a groove according to a region, a short circuit between electrodes in the outer peripheral region C1 can be prevented while maintaining a film thickness of a certain level or more as electrodes without using a plating resist. Therefore, in comparison with a case where a plating resist is used, a yield rate can be increased while suppressing the manufacturing cost.

In the solar cell 70 according to the present embodiment, the width $W_{A1}$ and the width $W_{A2}$ of the first conductive layer 19a and the second conductive layer 19b, which serve as bases for the n-side electrode 14 and the p-side electrode 15, are set such that the width $W_{A1}$ and the width $W_{A2}$ are different in the outer peripheral region C1 and in the inner region C2. More specifically, the width $W_{A1}$ in the outer peripheral region C1 where the third conductive layer 19c is likely to grow in the horizontal direction is set to be narrower than the width $W_{A2}$ in the inner region C2. Thereby, in the present embodiment, the width $W_{B1}$ and the width $W_{B2}$ of the n-side electrode 14 and the p-side electrode 15 can be uniformized in the outer peripheral region C1 and the inner region C2. This allows the power collection efficiency by the n-side electrode 14 and the p-side electrode 15 to be increased.

An outline of one embodiment is as shown in the following.

A solar cell 70 according to one embodiment includes:
a base substrate 10 that has a principle surface 10b;
a first conductive-type layer 12n that is provided in a first region W1 on the principle surface 10b;
a second conductive-type layer 13p that is provided in a second region W2, which is different from the first region W1, on the principle surface 10b;
an n-side electrode 14 that is provided on the first conductive-type layer 12n;
a p-side electrode 15 that is provided on the second conductive-type layer 13p; and
grooves 31 and 32 that separate the n-side electrode 14 and the p-side electrode 15 from each other.

The principle surface 10b has an outer peripheral region C1 provided along the outer periphery of the principle surface 10b and an inner region C2 provided inside the outer peripheral region C1.

The respective widths W51 and W52 of the grooves 31 and 32 in a direction in which the n-side electrode 14 and the p-side electrode 15 are spaced apart are set to be wider in the outer peripheral region C1 than in the inner region C2.

Second Embodiment

An explanation will be given in detail regarding the configuration of a solar cell module 100 in the present embodiment with reference to FIG. 10.

Figure 10:
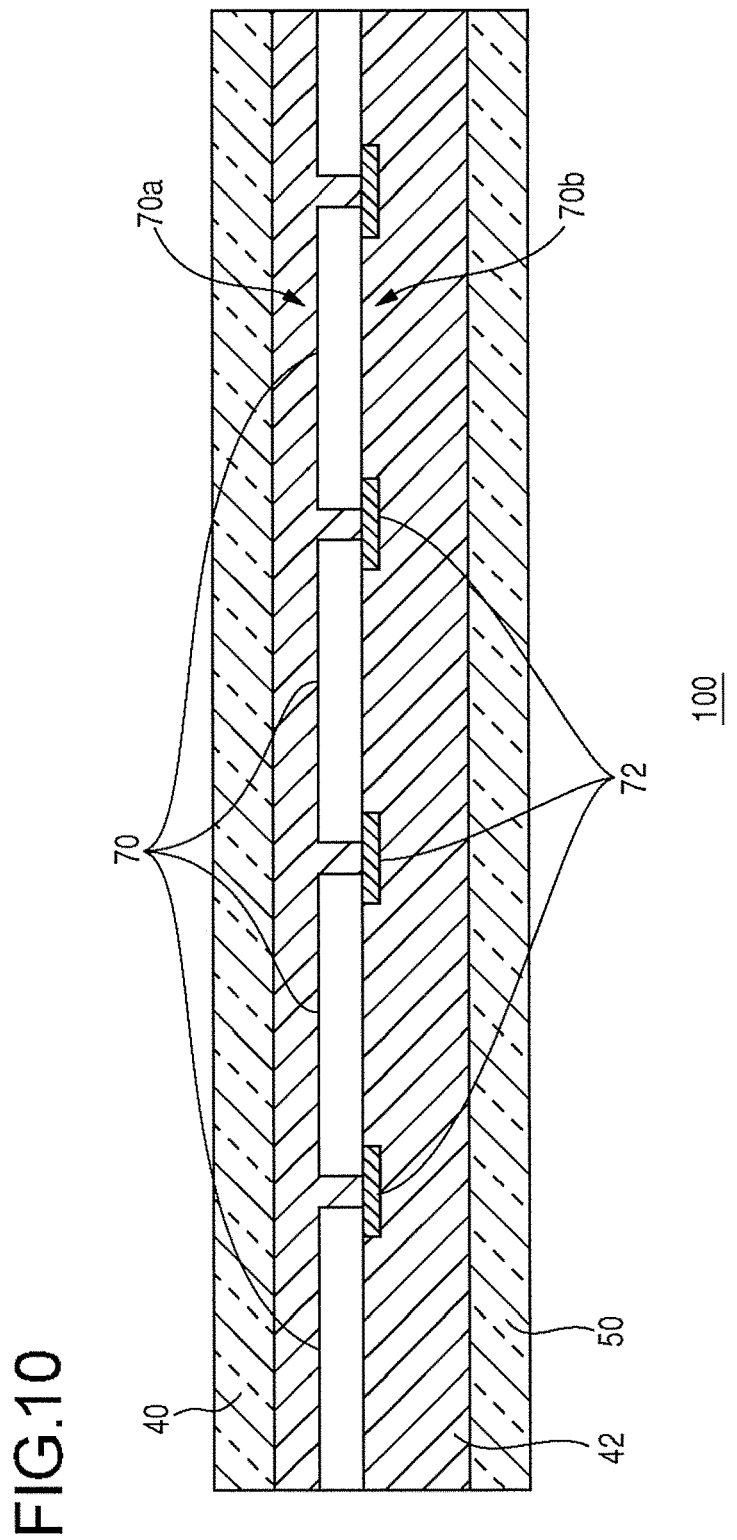
FIG. 10 is a cross-sectional view illustrating a structure of a solar cell module according to a second embodiment.

FIG. 10 is a cross-sectional view illustrating the structure of a solar cell module 100 according to a second embodiment.

The solar cell module 100 is sealed by a protection substrate 40, a sealing layer 42, and a back sheet 50 after connecting a plurality of solar cells 70 shown in the first embodiment by wiring members 72. The solar cell module 100 is provided with the plurality of solar cells 70, the wiring members 72, the protection substrate 40, the sealing layer 42, and the back sheet 50.

A wiring member 72 connects an n-side electrode of one of solar cells 70 that are adjacent to each other with a p-side electrode of the other solar cell 70. Therefore, the plurality of solar cells 70 are connected to one another in series by the wiring members 72. The solar cells 70 may be connected to one another in parallel by the wiring members 72.

The protection substrate 40 and the back sheet 50 are members that protect the solar cells 70 from the external environment. The protection substrate 40 that is provided on the side of a light-receiving surface 70a transmits light having a wavelength band that is absorbed by the solar cells 70 for the generation of power. The protection substrate 40 is, for example, a glass substrate. The back sheet 50 is formed of a resin substrate such as ethylene-vinyl acetate copolymers (EVA), polyvinyl butyral (PVB), polyamides, or the like or of a glass substrate that is the same as that for the protection substrate 40.

The sealing layer 42 is a resin material such as EVA, PVB, polyamides, or the like. This prevents, e.g., the infiltration of moisture to a power generation layer of the solar cell module 100 and also improves the overall strength of the solar cell module 100.

An explanation will now be given of a method of manufacturing a solar cell module 100 according to the present embodiment with reference to FIG. 11.

Figure 11:
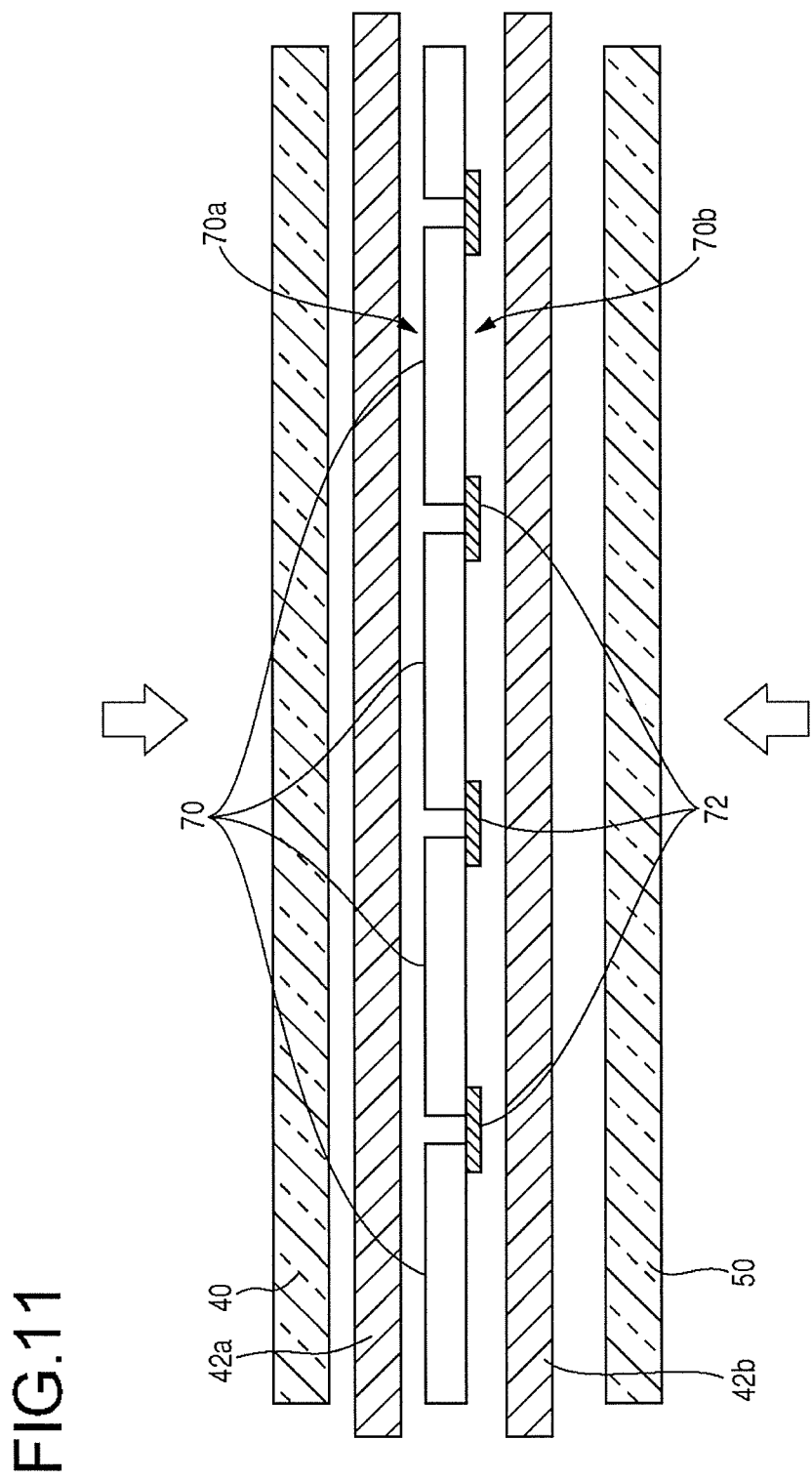
FIG. 11 is a cross-sectional view schematically illustrating a process of manufacturing the solar cell module.

FIG. 11 is a cross-sectional view schematically illustrating a process of manufacturing the solar cell module 100. First, a plurality of solar cells 70 are prepared, and the solar cells 70 are connected with one another by wiring members 72. A first sealing layer 42a and a protection substrate 40 are arranged on the side of a light-receiving surface 70a, and a second sealing layer 42b and a back sheet 50 are arranged on a back surface 70b. The solar cells 70 are then thermocompression-bonded while the solar cells 70 are being sandwiched between the protection substrate 40 and the back sheet 50. This allows the first sealing layer 42a and the second sealing layer 42b to be fused to form a sealing layer 42, and the solar cell module 100 shown in FIG. 10 is formed.

In the above-stated sealing process, the second sealing layer 42b that is softened by the heating gets into a groove provided on the back surface 70b of a solar cell 70 and becomes fused. The groove provided on the back surface 70b is provided such that the groove separates an n-side electrode and a p-side electrode that are formed in a comb shape. Thus, the sealing properties of the solar cell module 100 can be increased by allowing the sealing layer 42 to get into the groove.

Further, according to the solar cell module 100 in the present embodiment, the sealing layer 42 more easily gets into a groove provided in the outer peripheral region than into a groove provided in the inner region since a groove having a wide width is provided in the outer peripheral region of a solar cell 70. As a result, the adhesiveness between the solar cell 70 and the sealing layer 42 can be increased in the outer peripheral region at the back surface 70b of the solar cell 70. When the sealing properties of the solar cell module 100 are lost and moisture or the like gets inside the solar cell module 100, the reliability of the solar cell module 100 can be improved by increasing the adhesiveness in the outer peripheral region since the moisture or the like often enters the inside of the solar cell module 100 from an outer peripheral portion of the solar cell 70.

In the solar cell module 100 according to the present embodiment, light that enters the solar cell module 100 from above the protection substrate 40 can sometimes reach the back sheet 50 without entering the light-receiving surface 70a of the solar cell 70 and enter the back surface 70b after being reflected by the back sheet 50. Such light passes through gaps between the plurality of solar cells 70 and reaches the back sheet 50. Thus, the light mainly enters the outer peripheral regions of the respective back surfaces 70b. Light that enters the back surface 70b is reflected mainly by the n-side electrode and the p-side electrode. However, a portion of the light enters the base substrate 10 via a groove in which an electrode is not provided and contributes to the generation of power. In a solar cell 70 according to the present embodiment, a groove having a wide width is provided in the outer peripheral region of a back surface 70b thereof. Thus, the solar cell 70 allows light that enters the back surface 70b to contribute more to the generation of power. This allows the power generation efficiency of the solar cell module 100 to be increased.

Another embodiment relates to a solar cell module 100. This solar cell module 100 is provided with a plurality of solar cells 70 and a sealing layer 42 that seals the solar cells 70.

The solar cells 70 are provided with:
a base substrate 10 that has a principle surface 10b;
a first conductive-type layer 12n that is provided in a first region W1 on the principle surface 10b;
a second conductive-type layer 13p that is provided in a second region W2, which is different from the first region W1, on the principle surface 10b;

an n-side electrode 14 that is provided on the first conductive-type layer 12n;

a p-side electrode 15 that is provided on the second conductive-type layer 13p; and grooves 31 and 32 that separate the n-side electrode 14 and the p-side electrode 15 from each other.

The principle surface 10b has an outer peripheral region C1 provided along the outer periphery of the principle surface 10b and an inner region C2 provided inside the outer peripheral region C1.

The respective widths W51 and W52 of the grooves 31 and 32 in a direction in which the n-side electrode 14 and the p-side electrode 15 are spaced apart are set to be wider in the outer peripheral region C1 than in the inner region C2.

The present invention has been described by referring to each of the above-described embodiments. However, the present invention is not limited to the above-described embodiments only, and those resulting from any combination of them as appropriate or substitution are also within the scope of the present invention.

First Exemplary Variation

An explanation will be given in detail regarding the configuration of a solar cell 70 in a first exemplary variation with reference to FIG. 12.

Figure 12:
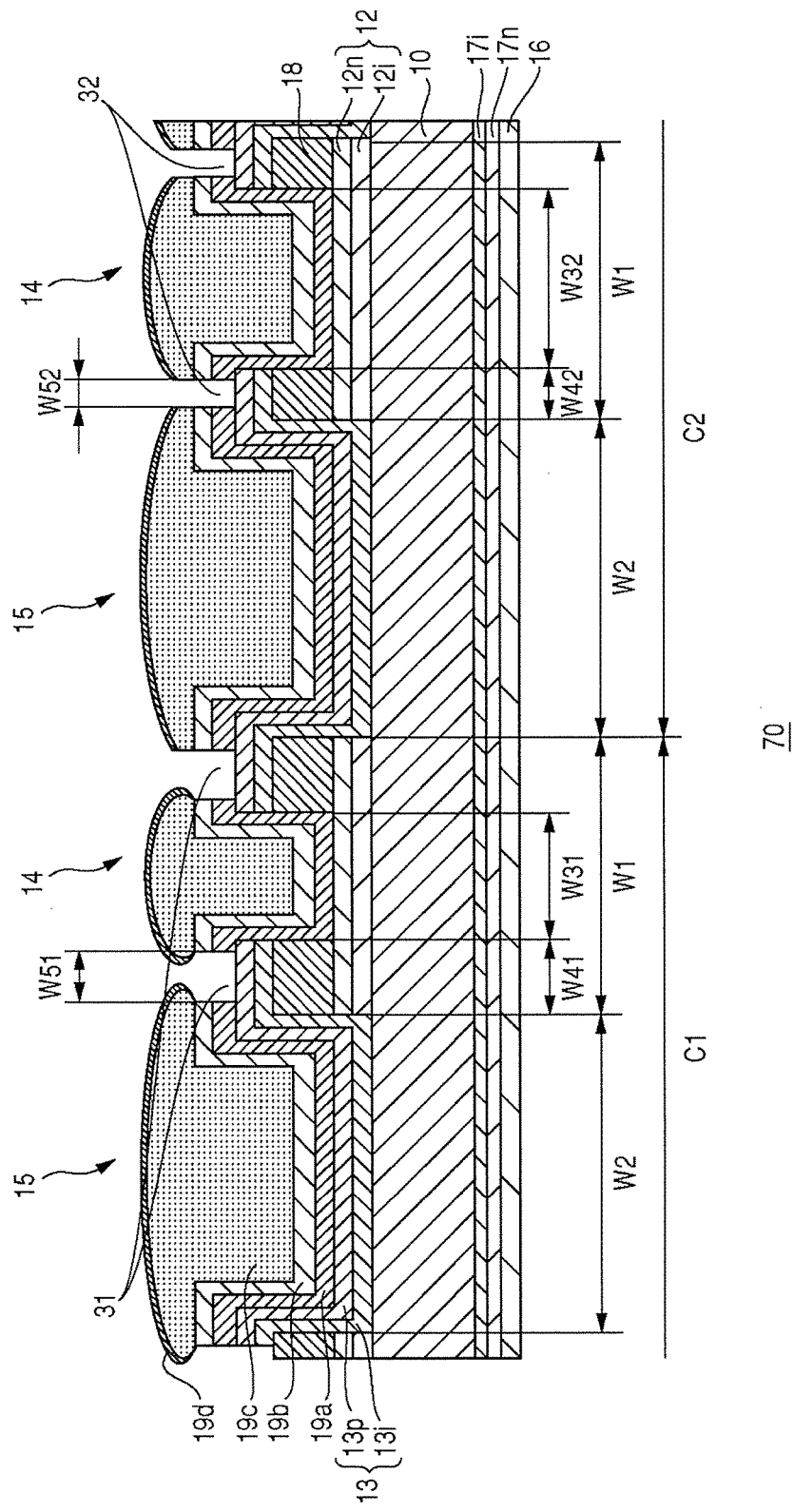
FIG. 12 is a cross-sectional view illustrating a structure of a solar cell in a first exemplary variation.

FIG. 12 is a cross-sectional view illustrating a structure of the solar cell 70 in the first exemplary variation.

The solar cell 70 in the first exemplary variation is different from the above-described solar cell 70 in the first embodiment in that the respective widths of fourth regions W41 and W42 in which a second insulating layer 18 is provided are different in an outer peripheral region C1 and in an inner region C2. An explanation will be given in the following mainly regarding differences from the first embodiment.

As for a second insulating layer 18 in the first exemplary variation, the width of the fourth region W41 and the width of the fourth region W42 are different in the outer peripheral region C1 and in the inner region C2. More specifically, as for a second insulating layer 18 in the outer peripheral region C1, the width of the fourth region W41 is set to be wide in response to the width W51 of a groove 31. On the other hand, as for a second insulating layer 18 in the inner region C2, the width of the fourth region W42 is set to be narrow in response to the width W52 of a groove 32. Thereby, in the first exemplary variation, the width of a third region W32 in which an n-side electrode 14 and a first conductive-type layer 12n come into contact with each other in the inner region C2 can be widened. This allows the power collection efficiency of the n-side electrode 14 to be increased and allows the power generation efficiency of a solar cell 70 to be increased.

A solar cell 70 according to one embodiment may be further provided with an insulating layer 18 provided between a first conductive-type layer 12n and a second conductive-type layer 13p. Grooves 31 and 32 may be arranged at a position where the insulating layer 18 is provided. The width of the insulating layer 18 in a direction in which an n-side electrode 14 and a p-side electrode 15 are spaced apart may be set to be wider in an outer peripheral region C1 than in an inner region C2.

Second Exemplary Variation

Figure 13:
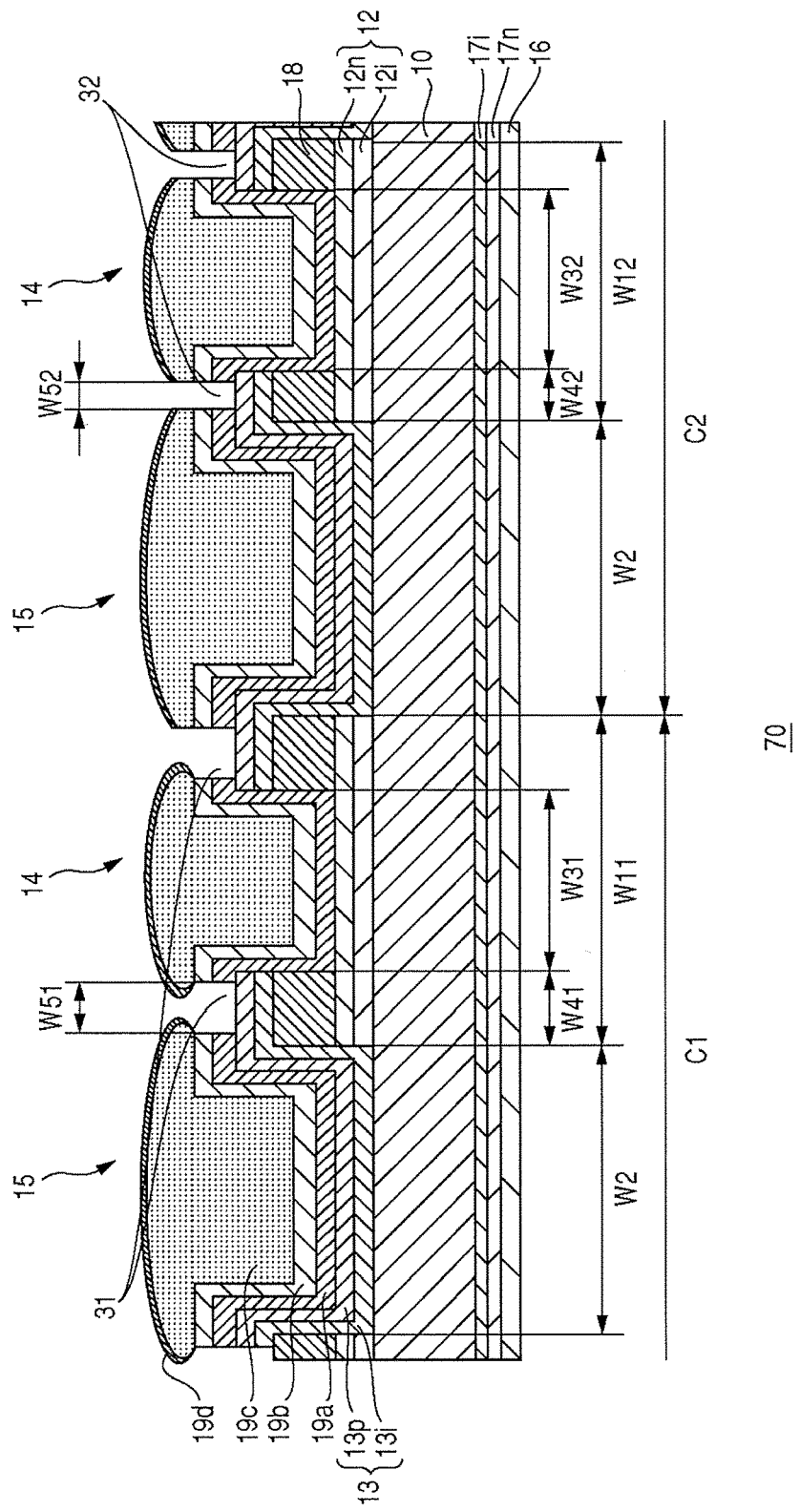
FIG. 13 is a cross-sectional view illustrating a structure of a solar cell in a second exemplary variation.

An explanation will be given in detail regarding the configuration of a solar cell 70 in a second exemplary variation with reference to FIG. 13.

FIG. 12 is a cross-sectional view illustrating a structure of the solar cell 70 in the second exemplary variation.

In the same way as in the above-described first exemplary variation, the solar cell 70 in the second exemplary variation is different from the above-described solar cell 70 in the first embodiment in that the width of a fourth region W41 and the width of a fourth region W42 each in which a second insulating layer 18 is provided are different in an outer peripheral region C1 and in an inner region C2. Further, the solar cell 70 in the second exemplary variation is different from the above-described solar cell 70 in the first exemplary variation in that the respective widths of first regions W11 and W12 in which a first stacked body 12 is provided are different in an outer peripheral region C1 and in an inner region C2. An explanation will be given in the following mainly regarding differences from the first embodiment and the first exemplary variation.

The width of a first stacked body 12 in the second exemplary variation varies according to whether the first regions W11 and W12, in which the first stacked body 12 is provided, are located in an outer peripheral region C1 or in an inner region C2. More specifically, as for a first stacked body 12 in the outer peripheral region C1, the width of the first region W11 is set to be wide in response to the width W51 of a groove 31. On the other hand, as for a first stacked body 12 in the inner region C2, the width of the first region W12 is set to be narrow in response to the width W52 of a groove 32. Thereby, in the second exemplary variation, the respective widths of third regions W31 and W32, each in which an n-side electrode 14 and a first conductive-type layer 12n come into contact with each other, can be uniformized in the outer peripheral region C1 and the inner region C2, and the power generation efficiency of the n-side electrode 14 can be increased. In particular, by widening the width of the third region W31 in the outer peripheral region C1, a decrease in the power generation efficiency can be suppressed.

Further, since a third conductive layer 19c is set to be thick due to the location dependency of a plating amount in an n-side electrode 14 provided in the outer peripheral region C1, the power collection capability of the n-side electrode 14 is higher compared to an n-side electrode 14 provided in the inner region C2. Thus, according to the power collection capability of the n-side electrode 14, the width of the first region W11 is set to be wide so as to increase the power generation amount in the outer peripheral region C1, while the width of the first region W12 is set to be narrow so as to reduce the power generation amount in the inner region C2. By changing the respective widths of the first regions W11 and W12 according to the power collection capability of the n-side electrode 14 as described, the power collection capability can be increased. This allows the power generation efficiency of the solar cell 70 to be increased.

As another exemplary variation, the width of the second region W2 in which the second stacked body 13 is provided may be changed in the outer peripheral region C1 and in the inner region C2. For example, in the outer peripheral region C1 in which the p-side electrode 15 having high power collection capability is provided, the width of the second region W2 may be set to be wider compared to the inner region C2. This allows the power collection capability of the solar cell 70 to be increased and allows the power generation efficiency of the solar cell 70 to be increased.

Third Exemplary Variation

In the above-described embodiment, the width of a groove is changed in an outer peripheral region C1 and in an inner region C2. As another exemplary variation, the width of a groove provided in an outer peripheral region C1 may be changed according to the distance from the outer periphery. For example, as for a plurality of grooves provided in the outer peripheral region C1, the respective widths of the grooves are widened as the distance from the outer periphery becomes shorter, and the respective widths of the grooves are narrowed as the distance from the outer periphery becomes longer. Meanwhile, the width of a groove provided in the inner region C2 is constant regardless of the distance from the outer periphery.

The density of electric lines of force caused by an electric field applied at the time of plating is constant in the inner region C2. On the other hand, the density becomes higher toward the outer periphery in the outer peripheral region C1. Therefore, while a plated layer is formed to have a constant film thickness in the inner region C2, the film thickness of a plated layer becomes thicker gradually toward the outer periphery and is likely to spread in the horizontal direction in the outer peripheral region C1. Thus, in the outer peripheral region C1, by widening the width of a groove toward the outer periphery, the width of a plated layer can be uniformized regardless of the location. This prevents electrical short circuit caused as a result of adjacent electrodes becoming in contact with each other and allows the power collection efficiency by the electrodes to be increased.

In a solar cell 70 according to one embodiment, the respective widths W51 and W52 of grooves 31 and 32 in a direction in which an n-side electrode 14 and a p-side electrode 15 are spaced apart may be set to be wider toward the outer periphery of a principle surface.

The respective widths W51 and W52 of the grooves 31 and 32 in the direction in which the n-side electrode 14 and the p-side electrode 15 are spaced apart in an outer peripheral region C1 may be determined according to the distance from the outer periphery. On the other hand, the widths W51 and W52 in a direction in which an n-side electrode 14 and a p-side electrode 15 are spaced apart in an inner region C2 may be determined regardless of the distance from the outer periphery.

It should be understood that the invention is not limited to the above-described embodiment, but may be modified into various forms on the basis of the spirit of the invention. Additionally, the modifications are included in the scope of the invention.

What is claimed is:
1. A solar cell comprising:
a base substrate that has a principle surface;
a first semiconductor layer that is provided in a first region on the principle surface;
a second semiconductor layer that is provided in a second region, which is different from the first region, on the principle surface;
an n-side electrode that includes a plurality of n-side finger electrodes extending in a first direction and that is provided on the first semiconductor layer; and
a p-side electrode that includes a plurality of p-side finger electrodes extending in the first direction and that is provided on the second semiconductor layer,
wherein the n-side finger electrodes and the p-side finger electrodes are alternately arrayed in a second direction that intersects with the first direction,
wherein the outer periphery of the principle surface has a first side extending in the first direction and a second side extending in the first direction and opposing the first side in the second direction,
wherein the principle surface has a first outer peripheral region provided along the first side, a second outer peripheral region provided along the second side, and an inner region provided between the first and second outer peripheral regions,
wherein a plurality of first grooves are provided in the first outer peripheral region to separate n-side finger electrodes and p-side finger electrodes,
wherein a plurality of second grooves are provided in the second outer peripheral region to separate n-side finger electrodes and p-side finger electrodes,
wherein a plurality of third grooves are provided in the inner region to separate the n-side finger electrodes and the p-side finger electrodes, and
wherein the widths of the first and second grooves in the second direction are larger than the widths of the third grooves in the second direction.

2. The solar cell according to claim 1, further comprising:
an insulating layer provided between the first semiconductor layer and the second semiconductor layer, the insulating layer including a first insulating layer provided at each of the plurality of first grooves, a second insulating layer provided at each of the plurality of second grooves, and a third insulating layer provided at each of the plurality of third grooves,
wherein the widths of the first and second insulating layers in the second direction are larger than the width of the third insulating layer in the second direction.

3. The solar cell according to claim 1,
wherein the widths of the plurality of first grooves in the second direction increase toward the first side, and
wherein the widths of the plurality of second grooves in the second direction increase toward the second side.

4. The solar cell according to claim 3,
wherein the widths of the plurality of first grooves in the second direction vary depending on the distance from the first side, the widths of the plurality of the second grooves in the second direction vary depending on the distance from the second side, and the widths of the plurality of second grooves in the second direction are constant regardless of the distance from the outer periphery.

5. A solar cell module comprising:
a plurality of solar cells and a sealing layer that seals the solar cells,
wherein the solar cells include:
a base substrate that has a principle surface;
a first semiconductor layer that is provided in a first region on the principle surface;
a second semiconductor layer that is provided in a second region, which is different from the first region, on the principle surface;
an n-side electrode that includes a plurality of n-side finger electrodes extending in a first direction and that is provided on the first semiconductor layer; and
a p-side electrode that includes a plurality of p-side finger electrodes extending in the first direction and that is provided on the second semiconductor layer,
wherein the n-side finger electrodes and the p-side finger electrodes are alternately arrayed in a second direction that intersects with the first direction,
wherein the outer periphery of the principle surface has a first side extending in the first direction and a second side extending in the first direction and opposing the first side in the second direction,
wherein the principle surface has a first outer peripheral region provided along the first side, a second outer peripheral region provided along the second side, and an inner region provided between the first and second outer peripheral regions, wherein a plurality of first grooves are provided in the first outer peripheral region to separate n-side finger electrodes and p-side finger electrodes, wherein a plurality of second grooves are provided in the second outer peripheral region to separate n-side finger electrodes and p-side finger electrodes, wherein a plurality of third grooves are provided in the inner region to separate the n-side finger electrodes and the p-side finger electrodes, and wherein the widths of the first and second grooves in the second direction are larger than the widths of the third grooves in the second direction.

* * * * *